(12) United States Patent
Kang

(10) Patent No.: US 12,438,533 B2
(45) Date of Patent: Oct. 7, 2025

(54) CLOCK DOUBLER AND A SEMICONDUCTOR APPARATUS USING THE SAME

(71) Applicant: SK hynix Inc., Icheon-si Gyeonggi-do (KR)

(72) Inventor: Ji Hyo Kang, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 8 days.

(21) Appl. No.: 18/519,412

(22) Filed: Nov. 27, 2023

(65) Prior Publication Data

US 2025/0047272 A1 Feb. 6, 2025

(30) Foreign Application Priority Data

Jul. 31, 2023 (KR) ........................ 10-2023-0099681

(51) Int. Cl.
*H03K 5/156* (2006.01)
*H03K 5/00* (2006.01)
*H03K 19/17784* (2020.01)

(52) U.S. Cl.
CPC ....... *H03K 5/1565* (2013.01); *H03K 5/00006* (2013.01); *H03K 19/17784* (2013.01)

(58) Field of Classification Search
CPC ............. H03K 5/1565; H03K 5/00006; H03K 19/17784; H03D 7/1441; H03F 2200/129; H03F 2200/135; H03F 2200/156; H03F 2200/159; H03F 2200/264; H03F 2200/375; H03F 2203/45114; H03F 2203/45156; H03F 2203/45171; H03F 2203/45174; H03F 3/005; H03F 3/45475; H03F 7/04

See application file for complete search history.

(56) References Cited

U.S. PATENT DOCUMENTS

| | | | |
|---|---|---|---|
| 5,151,624 A * | 9/1992 | Stegherr | G06G 7/163 327/356 |
| 6,943,606 B2 * | 9/2005 | Dunning | H03L 7/0814 327/246 |
| 9,124,250 B2 | 9/2015 | Hinrichs | |
| 9,214,928 B2 | 12/2015 | Berens et al. | |
| 10,998,896 B2 | 5/2021 | Hsieh | |
| 2010/0237925 A1 * | 9/2010 | Lin | H03K 3/35613 327/539 |
| 2019/0123728 A1 * | 4/2019 | Zhao | H04L 7/033 |

* cited by examiner

*Primary Examiner* — John W Poos
(74) *Attorney, Agent, or Firm* — WILLIAM PARK AND ASSOCIATES LTD.

(57) ABSTRACT

A clock doubler includes a first differential gate and a second differential gate. The first differential gate generates an output clock signal from a first clock signal, a first complementary clock signal, a second clock signal, and a second complementary clock signal and adjusts a duty cycle of the output clock signal based on a first bias control signal. The second differential gate generates a complementary output clock signal from the first clock signal, the first complementary clock signal, the second clock signal, and the second complementary clock signal and adjusts a duty cycle of the complementary output clock signal based on a second bias control signal.

20 Claims, 7 Drawing Sheets

CLOCK DOUBLER AND A SEMICONDUCTOR APPARATUS USING THE SAME

CROSS-REFERENCES TO RELATED APPLICATION

The present application claims priority under 35 U.S.C. § 119(a) to Korean application number 10-2023-0099681, filed on Jul. 31, 2023, in the Korean Intellectual Property Office, which is incorporated herein by reference in its entirety as set forth in full.

BACKGROUND

1. Technical Field

Various embodiments generally relate to an integrated circuit technology, and, more particularly, to a clock doubler, and a semiconductor apparatus using the same.

2. Related Art

An electronic device includes a lot of electronic elements and a computer system as the electronic device includes lots of semiconductor apparatuses each configured by a semiconductor. The semiconductor apparatuses configuring the computer system may perform data communication in synchronization with a clock signal. One semiconductor apparatus may transmit data synchronously with the clock signal, and another semiconductor apparatus connected to the one semiconductor apparatus may receive the data synchronously with the clock signal.

In order to improve data communication speeds, the frequency of clock signals used in the computer systems continues to increase. In general, clock signals with high frequencies have low amplitudes, so improved transmission circuits and improved reception circuits may be required to transmit the clock signals with high frequencies through a system bus. An approach that can reduce the burden of transmitting a clock signal through a system bus may be to generate a clock signal with a higher frequency from a clock signal with a lower frequency inside a semiconductor apparatus. Accordingly, the semiconductor apparatuses may include a clock doubler that can generate a clock signal with a higher frequency by multiplying the frequency of the clock signal.

SUMMARY

In an embodiment, a clock doubler may include a first differential gate and a second differential gate. The first differential gate may be configured to receive a first clock signal and a first complementary clock signal through a first differential input terminal of the first differential gate and receive a second clock signal and a second complementary clock signal through a second differential input terminal of the first differential gate to generate an output clock signal and may be configured to adjust a duty cycle of the output clock signal based on a first bias control signal. The second differential gate may be configured to receive the second clock signal and the second complementary clock signal through a first differential input terminal of the second differential gate and the first clock signal and the first complementary clock signal through a second differential input terminal of the second differential gate to generate a complementary output clock signal and may be configured to adjust a duty cycle of the complementary output clock signal based on a second bias control signal.

In an embodiment, a clock doubler may include a first differential gate, a second differential gate, and an output buffer. The first differential gate may be configured to receive a first clock signal, a first complementary clock signal, a second clock signal, and a second complementary clock signal to generate a complementary preliminary output clock signal and may be configured to adjust a duty cycle of the complementary preliminary output clock signal based on a first bias control signal. The second differential gate may be configured to receive the first clock signal, the first complementary clock signal, the second clock signal, and the second complementary clock signal to generate a preliminary output clock signal and may be configured to adjust a duty cycle of the preliminary output clock signal based on a second bias control signal. The output buffer may be configured to differentially amplify the preliminary output clock signal and the complementary preliminary output clock signal to generate an output clock signal and a complementary output clock signal and may be configured to selectively adjust a duty cycle of the output clock signal and the complementary output clock signal based on a switching signal.

In an embodiment, a semiconductor apparatus may include a first clock path, a second clock path, a selection circuit, and a multi-phase clock generator. The first clock path may be configured to buffer a first system clock signal and a second system clock signal to generate a first differential clock signal pair. The second clock path may be configured to generate a second differential clock signal pair from the first system clock signal and the second system clock signal and may be configured to adjust a duty cycle of the second differential clock signal pair based on a first bias control signal and a second bias control signal. The second differential clock signal pair may have a frequency higher than the first and second system clock signals. The selection circuit may be configured to output one of the first and second differential clock signal pairs as a reference clock signal pair based on an operation mode signal. The multi-phase clock generator may be configured to generate a plurality of internal clock signals based on the reference clock signal pair.

DETAILED DESCRIPTION

Figure 1:
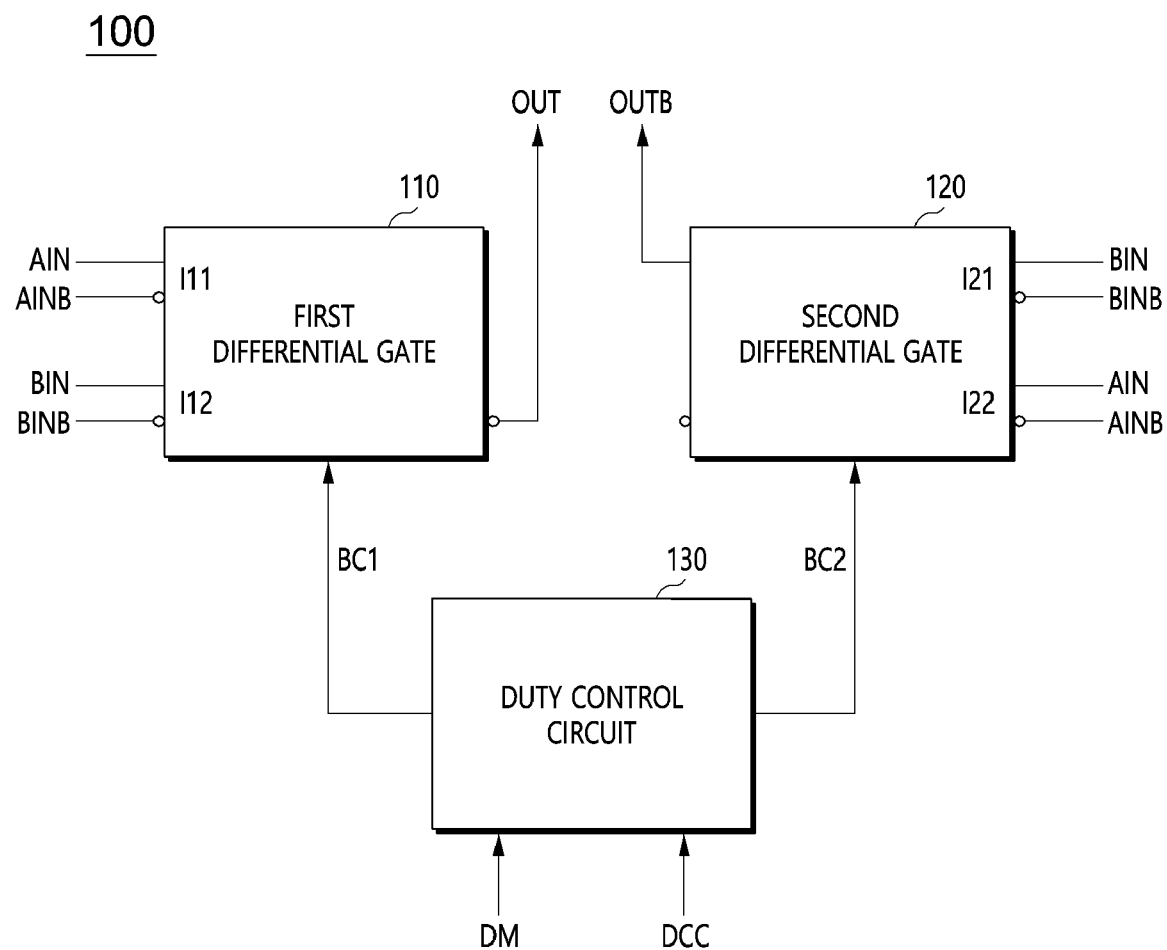
FIG. 1 is a block diagram illustrating a configuration of a clock doubler according to an embodiment.

FIG. 1 is a block diagram illustrating a configuration of a clock doubler 100 according to an embodiment. Referring to FIG. 1, the clock doubler 100 may receive a first clock signal AIN, a first complementary clock signal AINB, a second clock signal BIN, and a second complementary clock signal BINB to generate an output clock signal OUT and a complementary output clock signal OUTB. The first complementary clock signal AINB may have a complementary phase to the first clock signal AIN. The second complementary clock signal BINB may have a complementary phase to the second clock signal BIN. The second clock signal BIN may have a phase difference of 90 degrees from the first clock signal AIN and may have a lagged phase in comparison to the first clock signal AIN. The second complementary clock signal BINB may have a phase difference of 90 degrees from the first complementary clock signal AINB and may have a lagged phase to the first complementary clock signal AINB. The clock doubler 100 may generate the output clock signal OUT and the complementary output clock signal OUTB having a higher frequency than the first clock signal AIN and the second clock signal BIN from the first clock signal AIN, the first complementary clock signal AINB, the second clock signal BIN, and the second complementary clock signal BINB. The output clock signal OUT and the complementary output clock signal OUTB may have a frequency twice as high as the first and second clock signals AIN, BIN.

The clock doubler 100 may generate the output clock signal OUT and the complementary output clock signal OUTB by interpolating the phases of the first clock signal AIN, the first complementary clock signal AINB, the second clock signal BIN, and the second complementary clock signal BINB. For example, the clock doubler 100 may generate the output clock signal OUT and the complementary output clock signal OUTB by performing exclusive OR operations and/or exclusive NOR operations on the first clock signal AIN, the first complementary clock signal AINB, the second clock signal BIN, and the second complementary clock signal BINB. The clock doubler 100 may receive a first bias control signal BC1 and a second bias control signal BC2. The clock doubler 100 may adjust a duty cycle of the output clock signal OUT based on the first bias control signal BC1 and may adjust a duty cycle of the complementary output clock signal OUTB based on the second bias control signal BC2. The clock doubler 100 may further receive a duty control signal DCC. The clock doubler 100 may generate the first and second bias control signals BC1 and BC2 based on the duty control signal DCC. The clock doubler 100 may further receive a duty mode signal DM. The clock doubler 100 may generate the first and second bias control signals BC1 and BC2 such that the output clock signal OUT and the complementary output clock signal OUTB have a duty cycle of 50% based on the duty mode signal DM and the duty control signal DCC. The clock doubler 100 may generate the first and second bias control signals BC1 and BC2 to generate a distortion between the duty cycles of the output clock signal OUT and the complementary output clock signal OUTB based on the duty mode signal DM and the duty control signal DCC.

The clock doubler 100 may include a first differential gate 110 and a second differential gate 120. The first differential gate 110 may receive the first clock signal AIN, the first complementary clock signal AINB, the second clock signal BIN, and the second complementary clock signal BINB to generate the output clock signal OUT. The first differential gate 110 may receive the first bias control signal BC1 and may adjust the duty cycle of the output clock signal OUT based on the first bias control signal BC1. The first differential gate 110 may include a first differential input terminal I11 and a second differential input terminal I12. The first differential gate 110 may receive the first clock signal AIN and the first complementary clock signal AINB through the first differential input terminal I11 and may receive the second clock signal BIN and the second complementary clock signal BINB through the second differential input terminal I12. The first differential gate 110 may generate the output clock signal OUT by performing an exclusive OR operation and/or an exclusive NOR operation on the first clock signal AIN, the first complementary clock signal AINB, the second clock signal BIN, and the second complementary clock signal BINB. The first differential gate 110 may be a differential XOR gate and/or a differential XNOR gate. The first differential gate 110 may generate the output clock signal OUT having a low logic level when the first clock signal AIN and the second clock signal BIN have the same logic level and may generate the output clock signal OUT having a high logic level when the first clock signal AIN and the second clock signal BIN have different logic levels. The first differential gate 110 may include a first positive output node and a first negative output node. The first differential gate 110 may output the output clock signal OUT through the first negative output node. In an embodiment, the first differential gate 110 may further comprise an inverter (not shown) and may be modified to invert a signal output from the first positive output node by the inverter to generate the output clock signal OUT.

The second differential gate 120 may receive the first clock signal AIN, the first complementary clock signal AINB, the second clock signal BIN and the second complementary clock signal BIN to generate the complementary output clock signal OUTB. The second differential gate 120 may receive the second bias control signal BC2 and may adjust the duty cycle of the complementary output clock signal OUTB based on the second bias control signal BC2. The second differential gate 120 may include a first differential input terminal I21 and a second differential input terminal I22. The second differential gate 120 may receive the second clock signal BIN and the second complementary clock signal BINB through the first differential input terminal I21 and may receive the first clock signal AIN and the first complementary clock signal AINB through the second differential input terminal I22. The second differential gate 120 may perform an exclusive OR operation and/or an exclusive NOR operation on the first clock signal AIN, the first complementary clock signal AINB, the second clock signal BIN, and the second complementary clock signal BINB to generate the complementary output clock signal OUTB. The second differential gate 120 may be a differential XOR gate and/or a differential XNOR gate. The second differential gate 120 may generate the complementary output clock signal OUTB having a high logic level when the first clock signal AIN and the second clock signal BIN have the same logic level and may generate the complementary output clock signal OUTB having a low logic level when the first clock signal AIN and the second clock signal BIN have different logic levels. The second differential gate 120 may include a second positive output node and a second negative output node. The second differential gate 120 may output the complementary output clock signal OUTB through the second positive output node. In an embodiment, the second differential gate 120 may further comprise an inverter (not shown) and may be modified to invert a signal output from the second negative output node by the inverter to generate the complementary output clock signal OUTB.

The clock doubler 100 may further comprise a duty control circuit 130. The duty control circuit 130 may generate the first bias control signal BC1 and the second bias control signal BC2 based on the duty control signal DCC. The duty control signal DCC may be generated by detecting a duty cycle of a reference clock signal pair generated based on the output clock signal OUT and the complementary output clock signal OUTB. The duty control circuit 130 may change the value of the second bias control signal BC2 independently of the value of the first bias control signal BC1. The first bias control signal BC1 and the second bias control signal BC2 may have the same value or may have different values. The first bias control signal BC1 and the second bias control signal BC2 may be analogue voltage signals or may be digital signals comprising a plurality of bits. The duty control circuit 130 may provide the first bias control signal BC1 to the first differential gate 110 and the second bias control signal BC2 to the second differential gate 120.

The duty control circuit 130 may further receive the duty mode signal DM and may generate the first and second bias control signals BC1 and BC2 based on the duty mode signal DM and the duty control signal DCC. The duty mode signal DM may be a signal that distinguishes an operation mode of the clock doubler 100. For example, when the duty mode signal DM is at a first logic level, the clock doubler 100 may operate in a first duty operation mode, and the first duty operation mode may be a duty correction mode. When the duty mode signal DM is at a second logic level, the clock doubler 100 may operate in a second duty operation mode, and the second duty operation mode may be a duty distortion mode. The duty control circuit 130 may change the values of the first and second bias control signals BC1 and BC2 based on the duty mode signal DM and the duty control signal DCC. For example, when the duty mode signal DM is at a first logic level, the duty control circuit 130 may independently change the values of the first and second bias control signals BC1 and BC2 such that the output clock signal OUT and the complementary output clock signal OUTB each have a duty cycle of 50%. When the duty mode signal DM at a second logic level, the duty control circuit 130 may independently change the values of the first and second bias control signals BC1 and BC2 such that the output clock signal OUT and the complementary output clock signal OUTB have different duty cycles.

Figure 2:
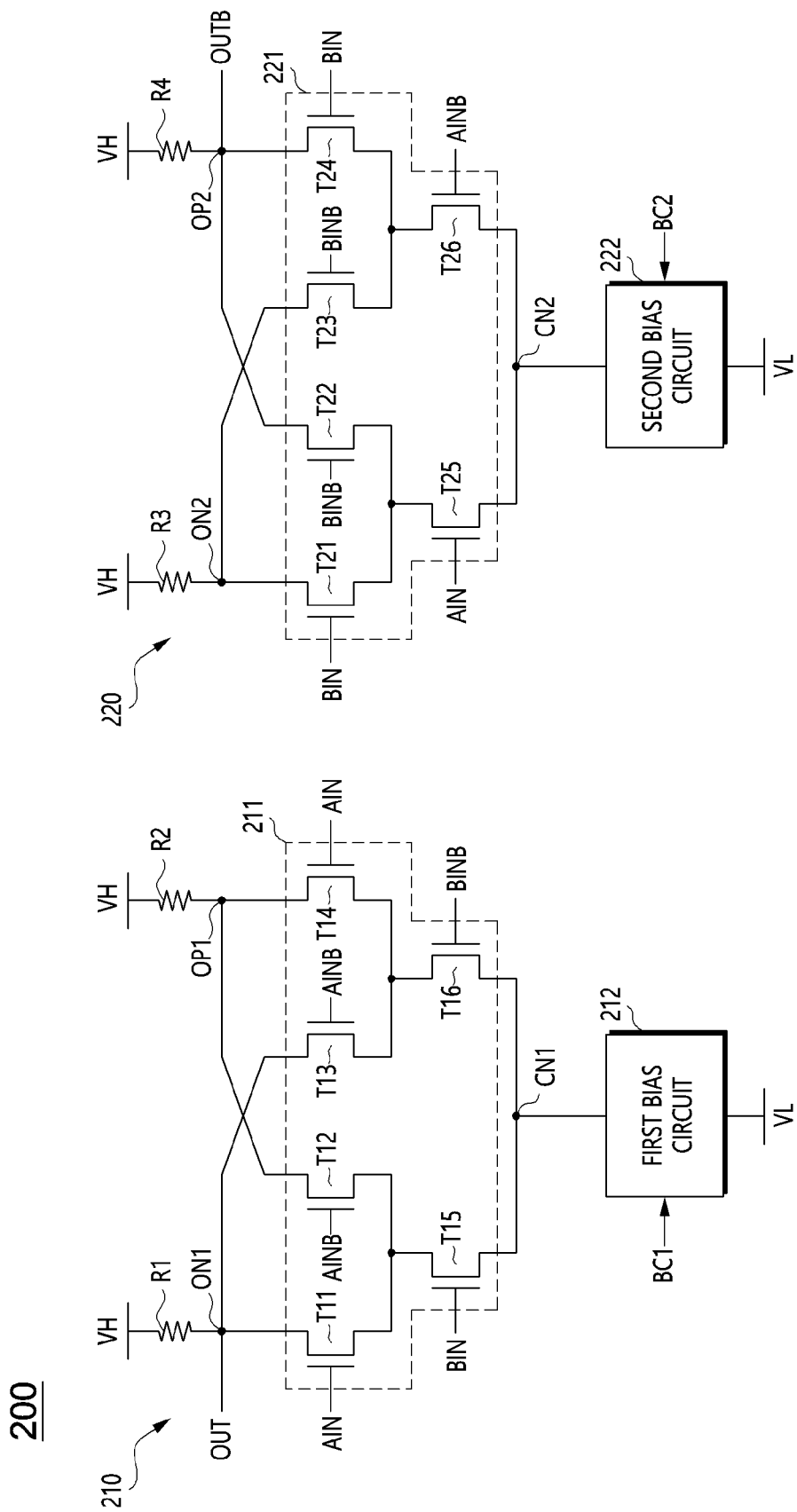
FIG. 2 is a diagram illustrating a configuration of a clock doubler according to an embodiment.

FIG. 2 is a diagram illustrating a configuration of the clock doubler 200 according to an embodiment. Referring to FIG. 2, the clock doubler 200 may include a first differential gate 210 and a second differential gate 220. The first differential gate 210 may be adapted to be the first differential gate 110 of FIG. 1, and the second differential gate 220 may be adapted to be the second differential gate 120 of FIG. 1. The first and second differential gates 210, 220 may receive a first power supply voltage VH and a second power supply voltage VL and may generate the output clock signal OUT and the complementary output clock signal OUTB having a voltage level between the first and second power supply voltages VH and VL. The voltage level of the first power supply voltage VH may be higher than the voltage level of the second power supply voltage VL. The first differential gate 210 may include a first differential circuit 211 and a first bias circuit 212. The first differential circuit 211 may receive the first clock signal AIN, the first complementary clock signal AINB, the second clock signal BIN, and the second complementary clock signal BINB to generate the output clock signal OUT. The first differential circuit 211 may be coupled between a first positive output node OP1, a first negative output node ON1, and a first common node CN1. The first positive output node OP1 and the first negative output node ON1 may be coupled with a terminal to which the first power supply voltage VH is supplied. The first differential circuit 211 may form a current path from the first negative output node ON1 to the first common node CN1 when the first clock signal AIN and the second clock signal BIN have the same logic level. The first differential circuit 211 may form a current path from the first positive output node OP1 to the first common node CN1 when the first clock signal AIN and the second clock signal BIN have different logic levels. The output clock signal OUT may be output through the first negative output node ON1.

The first bias circuit 212 may be coupled between the first common node CN1 and a terminal to which the second power supply voltage VL is supplied. The first bias circuit 212 may receive the first bias control signal BC1. Based on the first bias control signal BC1, the first bias circuit 212 may adjust the amount of current flowing from the first common node CN1 to the terminal to which the second power supply voltage VL is supplied. For example, the first bias circuit 212 may increase the amount of current flowing from the first common node CN1 to the terminal to which the second power supply voltage VL is supplied as the value of the first bias control signal BC1 increases. The first bias circuit 212 may decrease the amount of current flowing from the first common node CN1 to the terminal to which the second power supply voltage VL is supplied as the value of the first bias control signal BC1 decreases. For example, the first bias circuit 212 may increase the amount of current flowing from the first common node CN1 to the terminal to which the second power supply voltage VL is supplied, thereby reducing the duty cycle of the output clock signal OUT. The first bias circuit 212 may increase the duty cycle of the output clock signal OUT by decreasing the amount of current flowing from the first common node CN1 to the terminal to which the second power supply voltage VL is supplied. In an embodiment, increasing the duty cycle may mean lengthening a high-level portion of a clock signal, and decreasing the duty cycle may mean shortening a high-level portion of the clock signal.

The first differential circuit 211 may include a first transistor T11, a second transistor T12, a third transistor T13, a fourth transistor T14, a fifth transistor T15, and a sixth transistor T16. The first to sixth transistors T11, T12, T13, T14, T15, and T16 may be N-channel MOS transistors. The first to fourth transistors T11, T12, T13, and T14 may be first differential input terminals of the first differential circuit 211, and the fifth and sixth transistors T15 and T16 may be second differential input terminals of the first differential circuit 211. The gate of the first transistor T11 may receive the first clock signal AIN, and the drain of the first transistor T11 may be coupled with the first negative output node ON1. The gate of the second transistor T12 may receive the first complementary clock signal AINB, and the drain of the second transistor T12 may be coupled with the first positive output node OP1. A source of the second transistor T12 may be coupled with a source of the first transistor T11. A gate of the third transistor T13 may receive the first complementary clock signal AINB, and a drain of the third transistor T13 may be connected with the first negative output node ON1. The gate of the fourth transistor T14 may receive the first clock signal AIN, and the drain of the fourth transistor T14 may be connected with the first positive output node OP1. A source of the fourth transistor T14 may be connected with a source of the third transistor T13. The gate of the fifth transistor T15 may receive the second clock signal BIN, and the drain of the fifth transistor T15 may be connected with the sources of the first and second transistors T11, T12. The source of the fifth transistor T15 may be connected with the first common node CN1. The gate of the sixth transistor T16 may receive the second complementary clock signal BINB, and the drain of the sixth transistor T16 may be connected with the sources of the third and fourth transistors T13 and T14. The source of the sixth transistor T16 may be connected with the first common node CN1.

The first differential gate 210 may further include a first resistor R1 and a second resistor R2. The first resistor R1 may be connected between a terminal to which the first power supply voltage VH is supplied and the first negative output node ON1. The second resistor R2 may be connected between the terminal to which the first power supply voltage VH is supplied and the first positive output node OP1.

The second differential gate 220 may include a second differential circuit 221 and a second bias circuit 222. The second differential circuit 221 may receive the first clock signal AIN, the first complementary clock signal AINB, the second clock signal BIN, and the second complementary clock signal BINB to generate the complementary output clock signal OUTB. The second differential circuit 221 may be coupled between the second positive output node OP2, the second negative output node ON2, and the second common node CN2. The second positive output node OP2 and the second negative output node ON2 may be connected with the terminal to which is the first power supply voltage VH is supplied. The second differential circuit 221 may form a current path from the second negative output node ON2 to the second common node CN2 when the first clock signal AIN and the second clock signal BIN have the same logic level. The second differential circuit 221 may form a current path from the second positive output node OP2 to the second common node CN2 when the first clock signal AIN and the second clock signal BIN have different logic levels. The complementary output clock signal OUTB may be output through the second positive output node OP2.

The second bias circuit 222 may be coupled between the second common node CN2 and the terminal to which the second power supply voltage VL is supplied. The second bias circuit 222 may receive the second bias control signal BC2. Based on the second bias control signal BC2, the second bias circuit 222 may adjust the amount of current flowing from the second common node CN2 to the terminal to which the second power supply voltage VL is supplied. For example, the second bias circuit 222 may increase the amount of current flowing from the second common node CN2 to the terminal to which the second power supply voltage VL is supplied as the value of the second bias control signal BC2 increases. The second bias circuit 222 may decrease the amount of current flowing from the second common node CN2 to the terminal to which the second power supply voltage VL is supplied as the value of the second bias control signal BC2 decreases. For example, the second bias circuit 222 may increase the amount of current flowing from the second common node CN2 to the terminal to which the second power supply voltage VL is supplied, thereby reducing the duty cycle of the complementary output clock signal OUTB. The second bias circuit 222 may increase the duty cycle of the complementary output clock signal OUTB by decreasing the amount of current flowing from the second common node CN2 to the terminal to which the second power supply voltage VL is supplied.

The second differential circuit 221 may include a first transistor T21, a second transistor T22, a third transistor T23, a fourth transistor T24, a fifth transistor T25, and a sixth transistor T26. The first to sixth transistors T21, T22, T23, T24, T25, and T26 may be N-channel MOS transistors. The first to fourth transistors T21, T22, T23, and T24 may be first differential input terminals of the second differential circuit 221, and the fifth and sixth transistors T25 and T26 may be second differential input terminals of the second differential circuit 221. The gate of the first transistor T21 may receive the second clock signal BIN, and the drain of the first transistor T21 may be connected with the second negative output node ON2. The gate of the second transistor T22 may receive the second complementary clock signal BINB, and the drain of the second transistor T22 may be connected with the second positive output node OP2. A source of the second transistor T22 may be connected with a source of the first transistor T21. The gate of the third transistor T23 may receive the second complementary clock signal BINB, and the drain of the third transistor T23 may be connected with the second negative output node ON2. The gate of the fourth transistor T24 may receive the second clock signal BIN, and the drain of the fourth transistor T24 may be connected with the second positive output node OP2. A source of the fourth transistor T24 may be connected with a source of the third transistor T23. The gate of the fifth transistor T25 may receive the first clock signal AIN, and the drain of the fifth transistor T25 may be connected with the sources of the first and second transistors T21 and T22. The source of the fifth transistor T25 may be connected with the second common node CN2. The gate of the sixth transistor T26 may receive the first complementary clock signal AINB, and the drain of the sixth transistor T26 may be connected with the sources of the third and fourth transistors T23 and T24. The source of the sixth transistor T26 may be connected with the second common node CN2.

The second differential gate 222 may further include a third resistor R3 and a fourth resistor R4. The third resistor R3 may be connected between the terminal to which the first power supply voltage VH is supplied and the second negative output node ON2. The fourth resistor R4 may be connected between the terminal to which the first power supply voltage VH is supplied and the second positive output node OP2.

Figure 3:
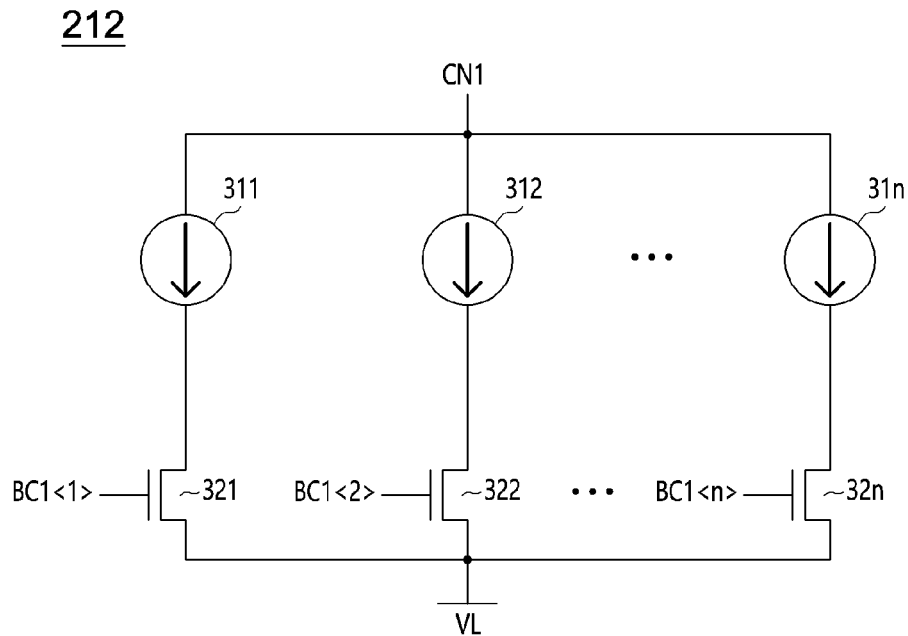
FIG. 3 is a diagram illustrating a configuration of a first bias circuit illustrated in FIG. 2.

FIG. 3 is a diagram showing the configuration of the first bias control circuit 212, shown in FIG. 2. Referring to FIG. 3, the first bias control circuit 212 may be coupled between the first common node CN1 and the terminal to which the second power supply voltage VL is supplied. The first bias control signal BC1<1:n> may be a digital signal comprising a plurality of bits, and the first bias control circuit 212 may comprise a plurality of current sources coupled in parallel between the first common node CN1 and the terminal to which the second power supply voltage VL is supplied. The first bias control circuit 212 may include a plurality of switching transistors connecting the plurality of current sources and the terminal to which the second power supply voltage VL is supplied, respectively, based on the first bias control signal BC1<1:n>. The first bias control circuit 212 may include a first to n current sources 311, 312, . . . , and 31n and a first to nth switching transistors 321, 322, . . . , and 32n. Here, n may be an integer of 3 or more. The first to nth switching transistors 321, 322, . . . , and 32n may be N-channel MOS transistors. One end of the first current source 311 may be coupled with the first common node CN1. A gate of the first switching transistor 321 may receive a first bit BC1<1> of the first bias control signal, a drain of the first switching transistor 321 may be connected with the other end of the first current source 311, and a source of the first switching transistor 321 may be connected with the terminal to which the second power supply voltage VL is supplied. One end of the second current source 312 may be coupled with the first common node CN1. A gate of the second switching transistor 322 may receive a second bit BC1<2> of the first bias control signal, a drain of the second switching transistor 322 may be connected with the other end of the second current source 312, and a source of the second switching transistor 322 may be connected with the terminal to which the second supply voltage VL is supplied. One end of the nth current source 31n may be coupled with the first common node CN1. A gate of the nth switching transistor 32n may receive a nth bit BC1<n> of the first bias control signal, a drain of the nth switching transistor 32n may be connected with the other end of the nth current source 31n, and a source of the nth switching transistor 32n may be connected with the terminal to which the second supply voltage VL is supplied. The amount of current flowing through the first to nth current sources 311, 312, . . . , and 31n may be substantially the same. As the number of switching transistors turned on, among the first to nth switching transistors 321, 322, . . . , and 32n, based on the first to nth bits BC1<1:n> of the first bias control signal increases, the amount of current flowing from the first common node CN1 to the terminal to which the second power supply voltage VL is supplied may increase. The second bias circuit 222 of FIG. 2 may have substantially the same configuration as the first bias circuit 212, shown in FIG. 3, except that it is coupled between the second common node CN2 and the terminal to which the second power supply voltage VL is supplied and receives the second bias control signal BC2 instead of the first bias control signal BC1<1:n>.

Figure 4:
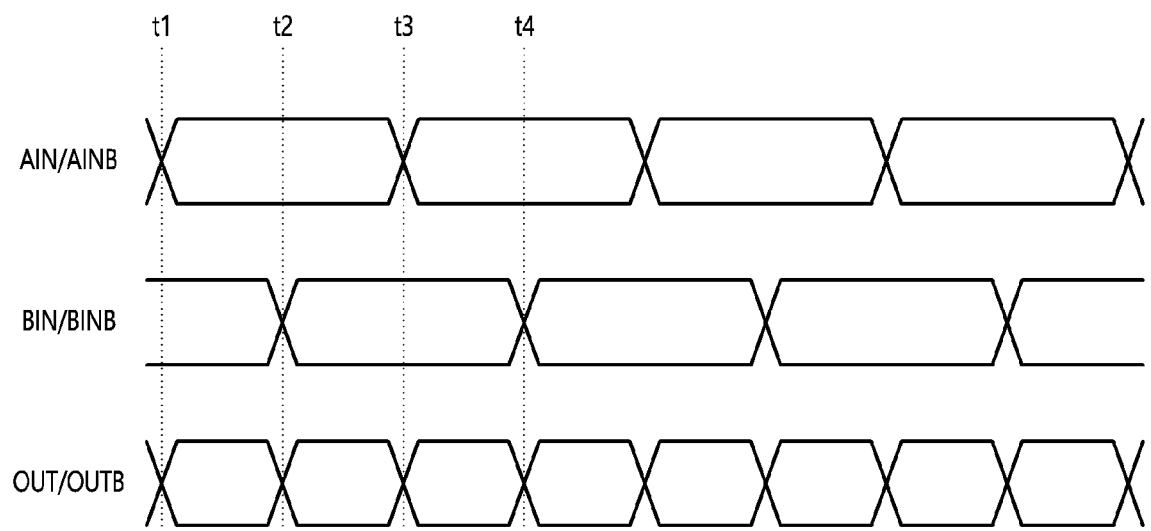
FIG. 4 is a timing diagram illustrating an operation of a clock doubler according to an embodiment.

FIG. 4 is a timing diagram illustrating an operation of the clock doubler 200 according to an embodiment. Referring to FIGS. 2 and 4, the operation of the clock doubler 200, according to an embodiment, will be described as follows. The first clock signal AIN and the second clock signal BIN may have a phase difference of 90 degrees, and the first complementary clock signal AINB and the second complementary clock signal BIB may also have a phase difference of 90 degrees. At t1, the first clock signal AIN may transition from a low logic level to a high logic level, and the first complementary clock signal AINB may transition from a high logic level to a low logic level. The second clock signal BIN may be at a low logic level, and the second complementary clock signal BINB may be at a high logic level. Because the first and second clock signals AIN and BIN have different logic levels, the first differential gate 210 may generate the output clock signal OUT having a high logic level, and the second differential gate 220 may generate the complementary output clock signal OUTB having a low logic level. At t2, the second clock signal BIN may transition from a low logic level to a high logic level, and the second complementary clock signal BINB may transition from a high logic level to a low logic level. Because the first and second clock signals AIN and BIN have the same logic level, the first differential gate 210 may generate the output clock signal OUT having a low logic level, and the second differential gate 220 may generate the complementary output clock signal OUTB having a high logic level. At t3, the first clock signal AIN may transition from a high logic level to a low logic level, and the first complementary clock signal AINB may transition from a low logic level to a high logic level. Because the first and second clock signals AIN and BIN have different logic levels, the first differential gate 210 may generate the output clock signal OUT having a high logic level, and the second differential gate 220 may generate the complementary output clock signal OUTB having a low logic level. At t4, the second clock signal BIN may transition from a high logic level to a low logic level and the second complementary clock signal BINB may transition from a low logic level to a high logic level. Because the first and second clock signals AIN and BIN have the same logic level, the first differential gate 210 may generate the output clock signal OUT having a low logic level, and the second differential gate 220 may generate the complementary output clock signal OUTB having a high logic level. Thus, the clock doubler 200 may generate the output clock signal OUT and the complementary output clock signal OUTB having a frequency of twice the frequency of the first and second clock signals AIN and BIN.

Figure 5:
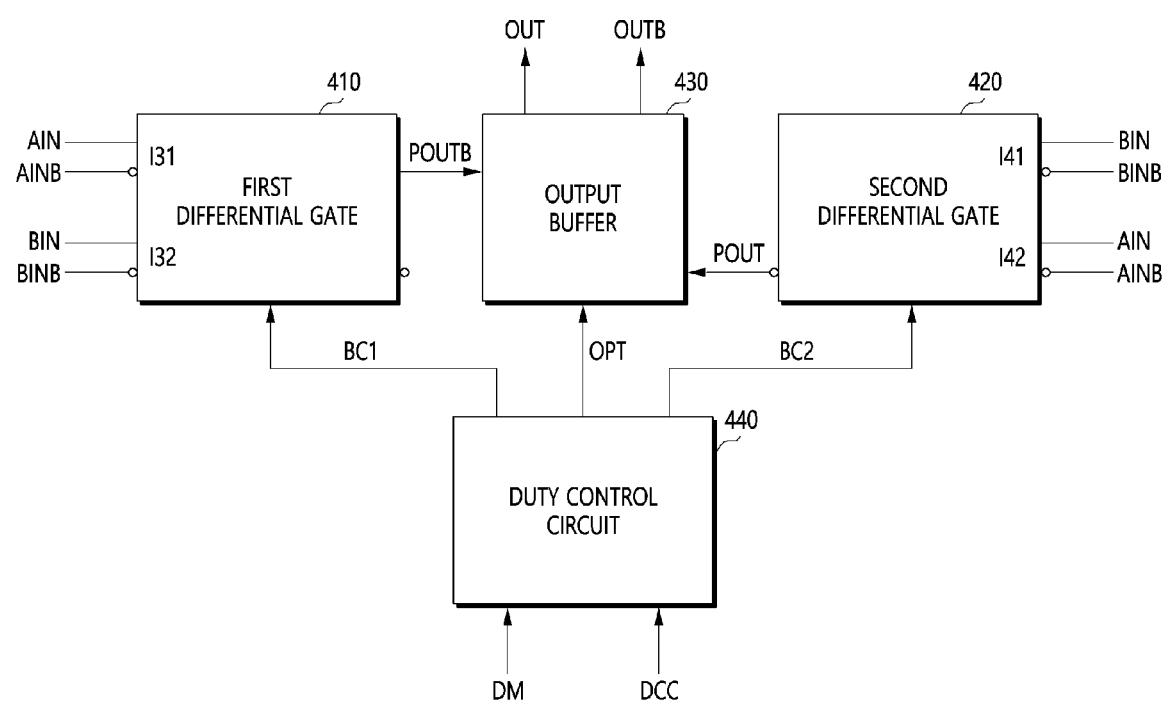
FIG. 5 is a block diagram illustrating a configuration of a clock doubler according to an embodiment.

FIG. 5 is a block diagram illustrating a configuration of the clock doubler 400 according to an embodiment. Referring to FIG. 5, the clock doubler 400 may receive a first clock signal AIN, a first complementary clock signal AINB, a second clock signal BIN, and a second complementary clock signal BINB to generate an output clock signal OUT and a complementary output clock signal OUTB. The clock doubler 400 may generate the output clock signal OUT and the complementary output clock signal OUTB from the first clock signal AIN, the first complementary clock signal AINB, the second clock signal BIN, and the second complementary clock signal BINB having a higher frequency than the first and second clock signals AIN and BIN. The clock doubler 400 may receive a first bias control signal BC1 and a second bias control signal BC2. The clock doubler 400 may generate a complementary preliminary output clock signal POUTB based on the first clock signal AIN, the first complementary clock signal AINB, the second clock signal BIN, and the second complementary clock signal BINB and may adjust the duty cycle of the complementary preliminary output clock signal POUTB based on the first bias control signal BC1. The clock doubler 400 may generate a preliminary output clock signal POUT based on the first clock signal AIN, the first complementary clock signal AINB, the second clock signal BIN, and the second complementary clock signal BINB and may adjust the duty cycle of the preliminary output clock signal POUT based on the second bias control signal BC2. The clock doubler 400 may differentially amplify the preliminary output clock signal POUT and the complementary preliminary output clock signal POUTB to generate the output clock signal OUT and the complementary output clock signal OUTB. The clock doubler 400 may receive a switching signal OPT and may selectively adjust the duty cycle of the output clock signal OUT and the complementary output clock signal OUTB based on the switching signal OPT. The clock doubler 400 may receive a duty mode signal DM and a duty control signal DCC and may generate the first bias control signal BC1, the second bias control signal BC2, and the switching signal OPT based on the duty mode signal DM and the duty control signal DCC.

The clock doubler 400 may include a first differential gate 410, a second differential gate 420, and an output buffer 430. The first differential gate 410 may receive the first clock signal AIN, the first complementary clock signal AINB, the second clock signal BIN, and the second complementary clock signal BINB to generate the complementary preliminary output clock signal POUTB. The first differential gate 410 may receive the first bias control signal BC1 and may adjust the duty cycle of the complementary preliminary output clock signal POUTB based on the first bias control signal BC1. The first differential gate 410 may include a first differential input terminal I31 and a second differential input terminal I32. The first differential gate 410 may receive the first clock signal AIN and the first complementary clock signal AINB through the first differential input terminal I31 and may receive the second clock signal BIN and the second complementary clock signal BINB through the second differential input terminal I32. The first differential gate 410 may perform an exclusive OR operation and/or an exclusive NOR operation on the first clock signal AIN, the first complementary clock signal AINB, the second clock signal BIN, and the second complementary clock signal BINB to generate the complementary preliminary output clock signal POUTB. The first differential gate 410 may be a differential XOR gate and/or a differential XNOR gate. The first differential gate 410 may generate the complementary preliminary output clock signal POUTB having a high logic level when the first clock signal AIN and the second clock signal BIN have the same logic level and may generate the complementary preliminary output clock signal POUTB having a low logic level when the first clock signal AIN and the second clock signal BIN have different logic levels. The first differential gate 410 may include a first positive output node and a first negative output node. The first differential gate 410 may output the complementary preliminary output clock signal POUTB through the first positive output node. The first differential gate 410 may have substantially the same configuration as the first differential gate 210, illustrated in FIG. 2, except for outputting the complementary preliminary output clock signal POUTB instead of the output clock signal OUT.

The second differential gate 420 may receive the first clock signal AIN, the first complementary clock signal AINB, the second clock signal BIN, and the second complementary clock signal BINB to generate the preliminary output clock signal POUT. The second differential gate 420 may receive the second bias control signal BC2 and may adjust the duty cycle of the preliminary output clock signal POUT based on the second bias control signal BC2. The second differential gate 420 may include a first differential input terminal I41 and a second differential input terminal I42. The second differential gate 420 may receive the second clock signal BIN and the second complementary clock signal BINB through the first differential input terminal I41 and may receive the first clock signal AIN and the first complementary clock signal AINB through the second differential input terminal I42. The second differential gate 420 may perform an exclusive OR operation and/or an exclusive NOR operation on the first clock signal AIN, the first complementary clock signal AINB, the second clock signal BIN, and the second complementary clock signal BINB to generate the preliminary output clock signal POUT. The second differential gate 420 may be a differential XOR gate and/or a differential XNOR gate. The second differential gate 420 may generate the preliminary output clock signal POUT having a low logic level when the first clock signal AIN and the second clock signal BIN have the same logic level and may generate the preliminary output clock signal POUT having a high logic level when the first clock signal AIN and the second clock signal BIN have different logic levels. The second differential gate 420 may include a second positive output node and a second negative output node. The second differential gate 420 may output the preliminary output clock signal POUT through the second negative output node. The second differential gate 420 may have substantially the same configuration as the second differential gate 220, illustrated in FIG. 2, except for outputting the preliminary output clock signal POUT instead of the complementary output clock signal OUTB.

The output buffer 430 may receive the complementary preliminary output clock signal POUTB from the first differential gate 410 and may receive the preliminary output clock signal POUT from the second differential gate 420. The output buffer 430 may differentially amplify the complementary preliminary output clock signal POUTB and the preliminary output clock signal POUT to generate the output clock signal OUT and the complementary output clock signal OUTB. The logic level of the output clock signal OUT may be changed according to the logic level of the preliminary output clock signal POUT, and the logic level of the complementary output clock signal OUTB may be changed according to the logic level of the complementary preliminary output clock signal POUTB. The output buffer 430 may receive the switching signal OPT and may adjust the duty cycle of the output clock signal OUT and the complementary output clock signal OUTB based on the switching signal OPT. When the switching signal OPT is at a first logic level, the output buffer 430 may adjust the duty cycle of the output clock signal OUT and the complementary output clock signal OUTB. For example, the output buffer 430 may average the duty cycle of the output clock signal OUT and the duty cycle of the complementary output clock signal OUTB to decrease the duty cycle difference between the output clock signal OUT and the complementary output clock signal OUTB. When the switching signal OPT is at a second logic level, the output buffer 430 might not adjust the duty cycle of the output clock signal OUT and the complementary output clock signal OUTB. In this case, the output clock signal OUT may have a duty cycle substantially equal to the duty cycle of the preliminary output clock signal POUT, and the complementary output clock signal OUTB may have a duty cycle substantially equal to the duty cycle of the complementary preliminary output clock signal POUTB.

The clock doubler 400 may further include a duty control circuit 440. The duty control circuit 440 may generate the first bias control signal BC1, the second bias control signal BC2, and the switching signal OPT based on the duty mode signal DM and the duty control signal DCC. The duty control signal DCC may be generated by detecting the duty cycle of a reference clock signal pair generated based on the output clock signal OUT and the complementary output clock signal OUTB. The duty control circuit 440 may change the value of the second bias control signal BC2 independently of the value of the first bias control signal BC1. The second bias control signal BC2 may have the same value as the first bias control signal BC1 or may have a different value than the first bias control signal BC1. The first bias control signal BC1 and the second bias control signal BC2 may be analogue voltage signals or may be digital signals comprising a plurality of bits. The duty control circuit 440 may provide the first bias control signal BC1 to the first differential gate 410 and the second bias control signal BC2 to the second differential gate 420. When the duty mode signal DM is at a first logic level, the clock doubler 400 may operate in a first duty operation mode, and the first duty operation mode may be a duty correction mode. When the duty mode signal DM is at a second logic level, the clock doubler 400 may operate in a second duty operation mode, and the second duty operation mode may be a duty distortion mode. When the duty mode signal DM is at the first logic level, the duty control circuit 440 may independently change the values of the first and second bias control signals BC1 and BC2 such that the output clock signal OUT, and the complementary output clock signal OUTB may each have a duty cycle of 50%. When the duty mode signal DM is at the second logic level, the duty control circuit 440 may independently change the values of the first and second bias control signals BC1 and BC2 such that the output clock signal OUT and the complementary output clock signal OUTB have different duty cycles. When the duty mode signal DM is at the first logic level, the duty control circuit 440 may generate the switching signal OPT that is disabled to a first logic level. When the duty mode signal DM is at the second logic level, the duty control circuit 440 may generate the switching signal OPT that is enabled to a second logic level.

Figure 6:
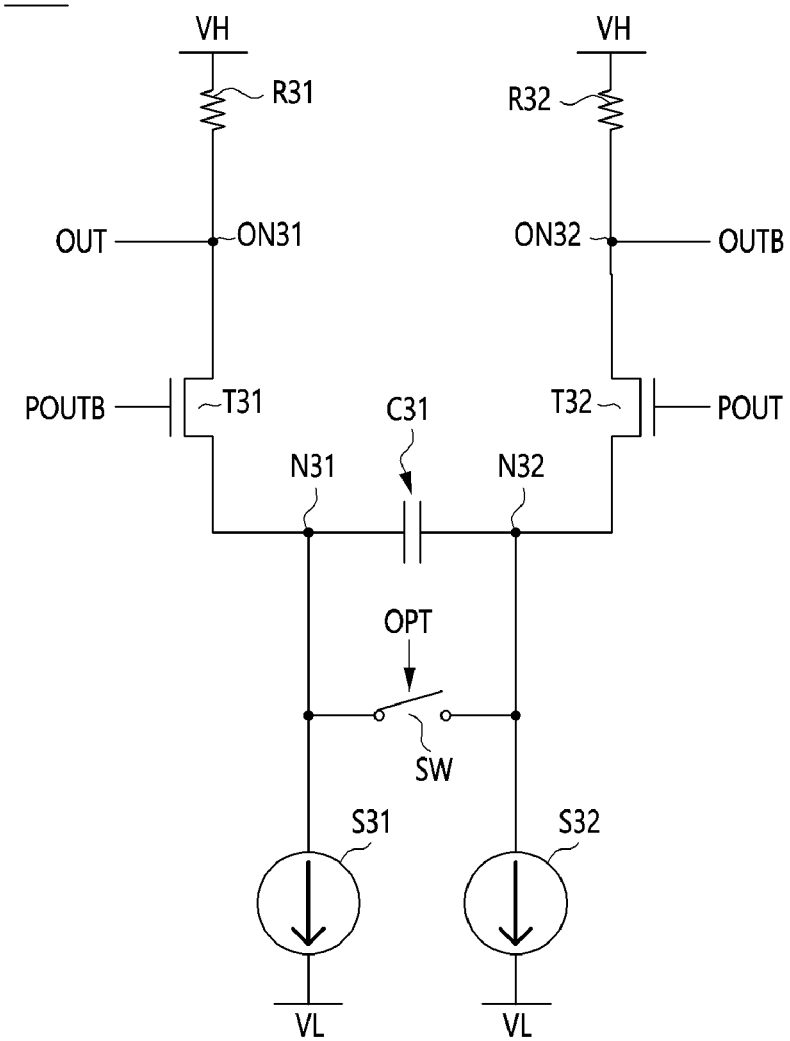
FIG. 6 is a diagram illustrating a configuration of an output buffer shown in FIG. 5.

FIG. 6 is a diagram illustrating a configuration of the output buffer 430, shown in FIG. 5. Referring to FIG. 6, the output buffer 430 may include a first transistor T31, a second transistor T32, a capacitor C31, a switch SW, a first current source S31, and a second current source S32. The first transistor T31 may be connected between the first output node ON31 and the first node N31 and may change the voltage level of the first output node ON31 based on the complementary preliminary output clock signal POUTB. The first output node ON31 may be coupled with the terminal to which a first power supply voltage VH is supplied, and the output clock signal OUT may be output through the first output node ON31. The second transistor T32 may be connected between the second output node ON32 and the second node N32 and may change the voltage level of the second output node ON32 based on the preliminary output clock signal POUT. The second output node ON32 may be coupled to the terminal to which the first power supply voltage VH is supplied, and the complementary output clock signal OUTB may be output through the second output node ON32. The first transistor T31 and the second transistor T32 may be N-channel MOS transistors. The gate of the first transistor T31 may receive the complementary preliminary output clock signal POUTB, the drain of the first transistor T31 may be connected to the first output node ON31, and the source of the first transistor T31 may be connected to the first node N31. The gate of the second transistor T32 may receive the preliminary output clock signal POUT, the drain of the second transistor T32 may be connected to the second output node ON32, and the source of the second transistor T32 may be connected to the second node N32. The capacitor C31 may be coupled between the first and second nodes N31 and N32. The switch SW may be coupled in parallel with the capacitor C31 between the first and second nodes N31 and N32. The switch SW may receive the switching signal OPT and selectively connect the first and second nodes N31 and N32 based on the switching signal OPT. The switch SW may be turned off when the switching signal OPT is disabled to a first logic level and turned on when the switching signal OPT is enabled to a second logic level. When the switch SW is turned off, the first and second nodes N31 and N32 may be connected through the capacitor. When the switch SW is turned on, the first and second nodes N31 and N32 may be connected directly. The first current source S31 may be coupled between the first node N31 and the terminal to which the second power supply voltage VL is supplied. The second current source S32 may be coupled between the second node N32 and the terminal to which the second power supply voltage VL is supplied. The amount of current flowing through the first current source S31 may be substantially the same as the amount of current flowing through the second current source S32. The output buffer 430 may further include a first resistor R31 and a second resistor R32. The first resistor R31 may be connected between the terminal to which the first power supply voltage VH is supplied and the first output node ON31. The second resistor R32 may be connected between the terminal to which the first power supply voltage VH is supplied and the second output node ON32.

When the duty mode signal DM is at the first logic level, the switch SW may be turned off, the first and second nodes N31 and N32 may be coupled through the capacitors, and the output buffer 430 may have the characteristics of a band pass filter. Thus, the duty cycles of the output clock signal OUT and the complementary output clock signal OUTB may be averaged so that the duty cycle difference between the output clock signal OUT and the complementary output clock signal OUTB may be decreased. When the duty mode signal DM is at the second logic level, the switch SW may be turned on, the first and second nodes N31 and N32 may be directly connected, and the output buffer 430 may have the characteristics of a low pass filter. Accordingly, the voltage levels of the first output node N31 and the second output node N32 may be changed independently according to the complementary preliminary output clock signal POUTB and the preliminary output clock signal POUT, respectively, and the duty cycle of the output clock signal OUT and the complementary output clock signal OUTB might not be adjusted.

Figure 7A:
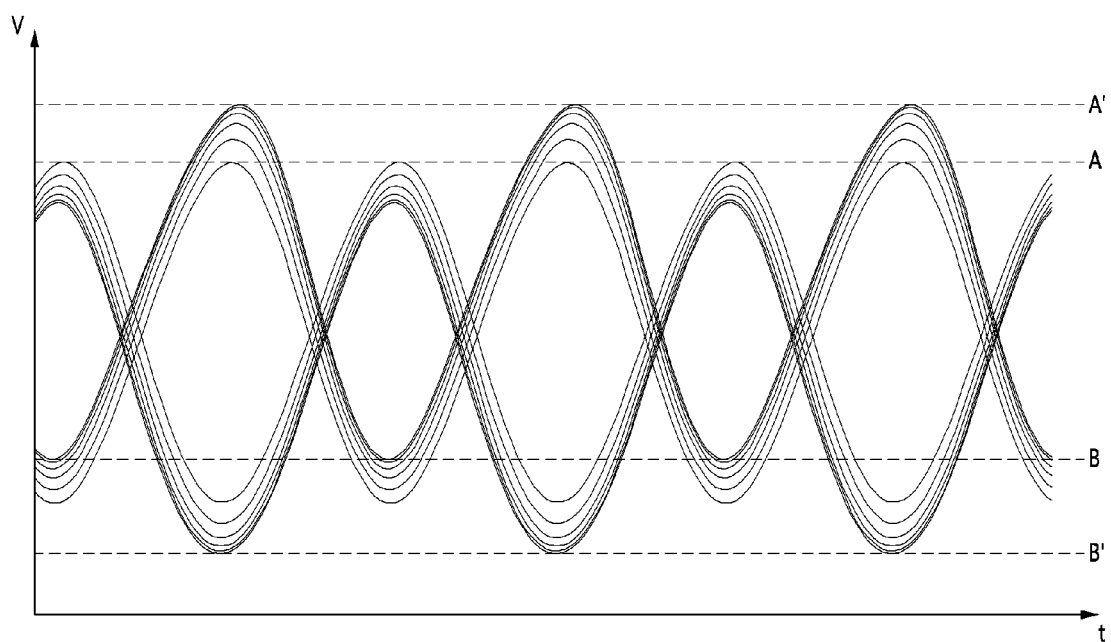
FIGS. 7A and 7B are timing diagrams illustrating operations of a clock doubler according to an embodiment.
Figure 7B:
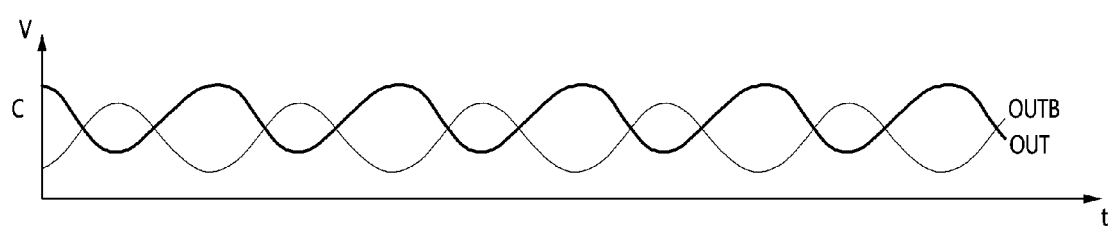
Figure 7B:
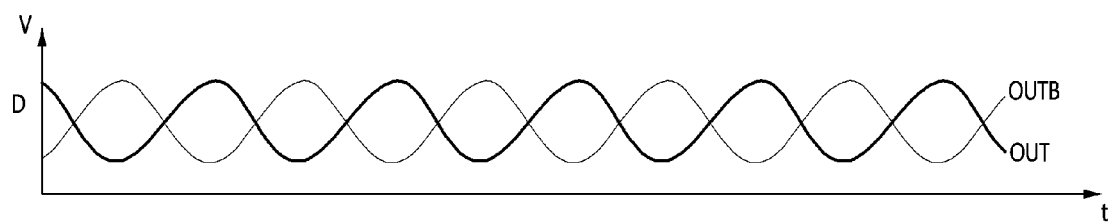

FIGS. 7A and 7B are timing diagrams illustrating an operation of the clock doubler 400 according to an embodiment. Referring to FIGS. 5 to 7B, the operation of the clock doubler 400 according to an embodiment will be described as follows. The clock doubler 400 may generate the output clock signal OUT and the complementary output clock signal OUTB, each having a frequency of twice the frequency of the first clock signal AIN and the second clock signal BIN as shown in FIG. 4. The clock doubler 400 may perform the following duty correction operation based on the first bias control signal BC1, the second bias control signal BC2, and the switching signal OPT.

TABLE 1

| BC1 and BC2 | Duty cycle of output clock signal | Type of correction |
| --- | --- | --- |
| BC1 Increased BC2 Decreased | Increased | Coarse duty correction |
| BC1 Decreased BC2 Increased | Decreased | Coarse duty correction |
| BC1 Increased BC2 Fixed | Increased | Fine duty correction |
| BC1 Fixed BC2 Increased | Decreased | Fine duty correction |

TABLE 2

| Duty mode signal DM | Duty operation mode | Switching signal OPT |
| --- | --- | --- |
| L | Duty correction mode | L |
| H | Duty distortion mode | H |

As described in Table 1, the duty control circuit 440 may be capable of adjusting the duty cycle of the output clock signal OUT and the complementary output clock signal OUTB by changing the values of the first and second bias control signals BC1 and BC2. When the duty control circuit 440 increases the value of the first bias control signal BC1 and decreases the value of the second bias control signal BC2, the first differential gate 410 may decrease the duty cycle of the complementary preliminary clock signal POUTB, and the second differential gate 420 may increase the duty cycle of the preliminary clock signal POUT. Thus, the duty cycle of the output clock signal OUT may be increased according to the duty cycle of the preliminary clock signal POUT, and the duty cycle of the complementary output clock signal OUTB may be decreased according to the duty cycle of the complementary preliminary clock signal POUTB. The duty cycle difference between the output clock signal OUT and the complementary output clock signal OUTB may be relatively greatly changed, and coarse duty correction may be performed. When the duty control circuit 440 decreases the value of the first bias control signal BC1 and increases the value of the second bias control signal BC2, the first differential gate 410 may increase the duty cycle of the complementary preliminary output clock signal POUTB, and the second differential gate 420 may decrease the duty cycle of the preliminary output clock signal POUT. Thus, the duty cycle of the output clock signal OUT may be decreased in accordance with the duty cycle of the preliminary clock signal POUT, and the duty cycle of the complementary output clock signal OUTB may be increased in accordance with the duty cycle of the complementary preliminary clock signal POUTB. The duty cycle difference between the output clock signal OUT and the complementary output clock signal OUTB may be relatively greatly changed, and the coarse duty correction may be performed.

When the duty control circuit 440 increases the value of the first bias control signal BC1 and maintains the value of the second bias control signal BC2, the first differential gate 410 may decrease the duty cycle of the complementary preliminary output clock signal POUTB, and the second differential gate 420 may maintain the duty cycle of the preliminary output clock signal POUT. Thus, as the duty cycle of the output clock signal OUT is maintained and the duty cycle of the complementary output clock signal OUTB is decreased in accordance with the duty cycle of the complementary preliminary clock signal POUTB, the duty cycle of the output clock signal OUT may be relatively increased. The duty cycle difference between the output clock signal OUT and the complementary output clock signal OUTB may be relatively slightly changed, and fine duty correction may be performed. When the duty control circuit 440 increases the value of the second bias control signal BC2 and maintains the value of the first bias control signal BC1, the first differential gate 410 may maintain the duty cycle of the complementary preliminary output clock signal POUTB, and the second differential gate 420 may decrease the duty cycle of the preliminary output clock signal POUT. Thus, the duty cycle of the output clock signal OUT may be decreased in accordance with the duty cycle of the preliminary clock signal POUT and the duty cycle of the complementary output clock signal OUTB may be maintained. The duty cycle difference between the output clock signal OUT and the complementary output clock signal OUTB may be relatively slightly changed, and the fine duty correction may be performed.

When the duty mode signal DM is at a low logic level, the clock doubler 400 may operate in the duty correction mode. The duty control circuit 440 may disable the switching signal OPT to a low logic level based on the duty mode signal DM, and the switch SW may be turned off based on the switching signal OPT. When the switch SW is turned off, the output buffer 430 may have the characteristics of a band pass filter and may decrease the duty cycle difference between the output clock signal OUT and the complementary output clock signal OUTB. When the duty mode signal DM is at a high logic level, the clock doubler 400 may operate in the duty distortion mode. The duty control circuit 440 may enable the switching signal OPT to a high logic level based on the duty mode signal DM, and the switch SW may be turned on based on the switching signal OPT. When the switch SW is turned on, the output buffer 430 may have the characteristics of a low pass filter and might not change the duty cycle difference between the output clock signal OUT and the complementary output clock signal OUTB.

As shown in FIG. 7A, the first and second differential gates 410 and 420 may change the swing width and/or amplitude of the complementary preliminary output clock signal POUTB and the preliminary output clock signal POUT based on the first and second bias control signals BC1 and BC2. In FIG. 7A, the horizontal axis t may be time, and the vertical axis V may be voltage level. When swing width and/or amplitude of the complementary preliminary output clock signal POUTB and the preliminary output clock signal POUT are changed, swing width and/or amplitude of the output clock signal OUT and the complementary output clock signal OUTB may be changed. When the amount of current flowing through the bias circuit of the first differential gate 410 is increased, the swing level of the complementary output clock signal OUTB may fall in the direction from B to B', thereby decreasing the duty cycle of the complementary output clock signal OUTB, and the swing level of the output clock signal OUT may rise in the direction from A to A', thereby increasing the duty cycle of the output clock signal OUT. When the amount of current flowing through the bias circuit of the first differential gate 410 decreases, the swing level of the complementary output clock signal OUTB may rise in the direction from A to A', thereby increasing the duty cycle of the complementary output clock signal OUTB, and the swing level of the output clock signal OUT may fall in the direction from B to B', thereby decreasing the duty cycle of the output clock signal OUT. Similarly, when the amount of current flowing through the bias circuit of the second differential gate 420 increases, the swing level of the output clock signal OUT may fall from B to B', thereby decreasing the duty cycle of the output clock signal OUT, and the swing level of the complementary output clock signal OUTB may rise from A to A', thereby increasing the duty cycle of the complementary output clock signal OUTB. When the amount of current flowing through the bias circuit of the second differential gate 420 decreases, the swing level of the output clock signal OUT may rise in the direction from A to A', thereby increasing the duty cycle of the output clock signal OUT, and the swing level of the complementary output clock signal OUTB may fall in the direction from B to B', thereby decreasing the duty cycle of the complementary output clock signal OUTB.

In FIG. 7B, the horizontal axis may represent time t and the vertical axis may represent voltage level V. Referring to FIG. 7B, when a phase skew between the first clock signal AIN and the second clock signal BIN exists, and no duty correction operation is performed by the first differential gate 410, the second differential gate 420, and the output buffer 430, a duty cycle difference between the output clock signal OUT and the complementary output clock signal OUTB output from the clock doubler 400 may increase, as shown in graph C. When a duty correction operation is performed by the first differential gate 410, the second differential gate 420, and the output buffer 430, the duty cycle difference between the output clock signal OUT and the complementary output clock signal OUTB output from the clock doubler 400 may be decreased, as shown in graph D.

Figure 8:
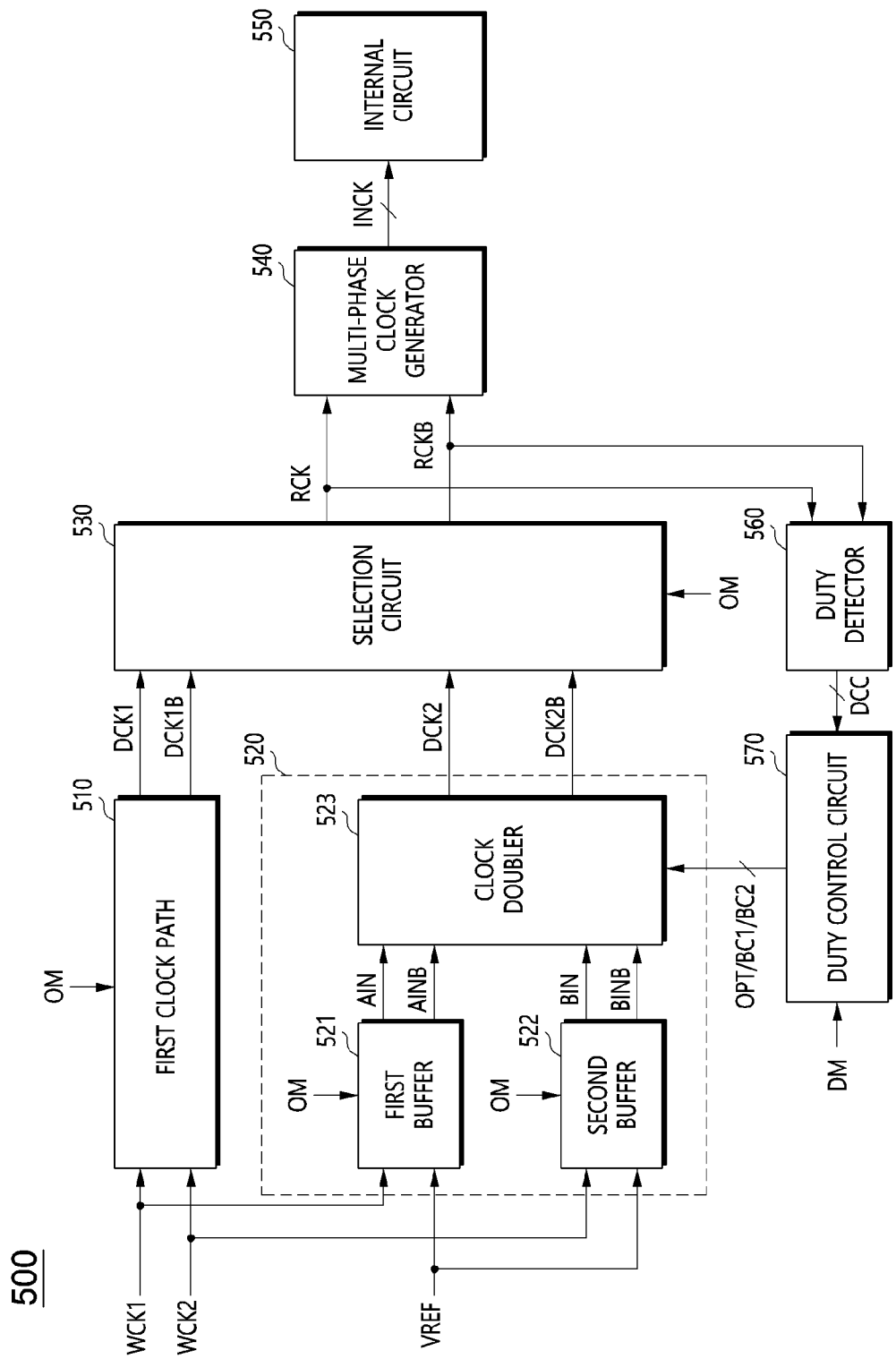
FIG. 8 is a block diagram illustrating a configuration of a semiconductor apparatus according to an embodiment.

FIG. 8 is a block diagram illustrating a configuration of a semiconductor apparatus 500 according to an embodiment. Referring to FIG. 8, the semiconductor apparatus 500 may receive a system clock signal and may generate an internal clock signal. The semiconductor apparatus 500 may perform various operations based on the system clock signal. The semiconductor apparatus 500 may include a first clock path 510, a second clock path 520, a selection circuit 530, a multi-phase clock generator 540, and an internal circuit 550. The first clock path 510 may receive a first system clock signal WCK1 and a second system clock signal WCK2. The first and second system clock signals WCK1 and WCK2 may be clock signals provided by an external device (not shown) of the semiconductor apparatus 500. The first clock path 510 may buffer the first and second system clock signals WCK1 and WCK2 to generate a first differential clock signal pair DCK1/DCK1B. The first clock path 510 may include at least one of a current mode logic (CML) buffer and a complementary metal-oxide-semiconductor (CMOS) buffer. The second clock path 520 may receive the first and second system clock signals WCK1 and WCK2 to generate a second differential clock signal pair DCK2/DCK2B. The second clock path 520 may multiply the frequencies of the first and second system clock signals WCK1 and WCK2 to generate the second differential clock signal pair DCK2/DCK2B having a higher frequency than the first and second system clock signals WCK1 and WCK2. For example, the second differential clock signal pair DCK2/DCK2B may have a frequency that is twice as high as the frequency of the first and second system clock signals WCK1 and WCK2.

The semiconductor apparatus 500 may operate in a first operation mode and a second operation mode. The first operation mode may be a normal operation mode, and the second operation mode may be a screen mode. The normal operation mode may be an operation mode in which the semiconductor apparatus 500 is coupled to the external device and performs data communication with the external device. The screen mode may be an operation mode for testing and/or verifying operational reliability of the semiconductor apparatus 500. In the first operation mode, the first and second system clock signals WCK1 and WCK2 may have a phase difference of 180 degrees, and the second system clock signal WCK2 may be a complementary clock signal of the first system clock signal WCK1. In the first operation mode, the first clock path 510 may be activated, and the first clock path 510 may generate the first differential clock signal pair DCK1/DCK1B from the first and second system clock signals WCK1 and WCK2. In the second operation mode, the first and second system clock signals WCK1 and WCK2 may have a phase difference of 90 degrees. The first system clock signal WCK1 may have a leading phase of 90 degrees compared to the second system clock signal WCK2. In the second operation mode, the second clock path 520 may be activated, and the second clock path 520 may generate the second differential clock signal pair DCK2/DCK2B from the first and second system clock signals WCK1 and WCK2. In an embodiment, the first and second system clock signals WCK1 and WCK2 received in the second operation mode may have a lower frequency than the first and second system clock signals WCK1 and WCK2 received in the first operation mode.

The second clock path 520 may further receive at least a first bias control signal BC1 and a second bias control signal BC2. The second clock path 520 may adjust the duty cycle of the second differential clock signal pair DCK2/DCK2B based on at least one of the first bias control signal BC1 and the second bias control signal BC2. The second clock path 520 may further receive a switching signal OPT. The second clock path 520 may further adjust the duty cycle of the second differential clock signal pair DCK2/DCK2B based on the switching signal OPT.

The selection circuit 530 may receive the first differential clock signal pair DCK1/DCK1B from the first clock path 510 and may receive the second differential clock signal pair DCK2/DCK2B from the second clock path 520. The selection circuit 530 may output one of the first differential clock signal pair DCK1/DCK1B and the second differential clock signal pair DCK2/DCK2B as a reference clock signal pair RCK/RCKB according to the operation mode of the semiconductor apparatus 500. In the first operation mode, the selection circuit 530 may output the first differential clock signal pair DCK1/DCK1B as the reference clock signal pair RCK/RCKB. In the second operation mode, the selection circuit 530 may output the second differential clock signal pair DCK2/DCK2B as the reference clock signal pair RCK/RCKB. The selection circuit 530 may receive an operation mode signal OM. The operation mode signal OM may be a signal distinguishing between the first operation mode and the second operation mode of the semiconductor apparatus 500. For example, the operation mode signal OM may have a first logic level for identifying the first operation mode and a second logic level for identifying the second operation mode. The selection circuit 530 may output the first differential clock signal pair DCK1/DCK1B as the reference clock signal pair RCK/RCKB when the operation mode signal OM is at the first logic level. The selection circuit 530 may output the second differential clock signal pair DCK2/DCK2B as the reference clock signal pair RCK/RCKB when the operation mode signal OM is at the second logic level.

The multi-phase clock generator 540 may receive the reference clock signal pair RCK/RCKB from the selection circuit 530. The multi-phase clock generator 540 may generate a plurality of internal clock signals INCK from the reference clock signal pair RCK/RCKB. The multi-phase clock generator 540 may generate the plurality of internal clock signals INCK having at least two different phases from the reference clock signal pair RCK/RCKB. The multi-phase clock generator 540 may include a buffer circuit to buffer the reference clock signal pair RCK/RCKB and/or a divider circuit capable of dividing the frequency of the reference clock signal pair RCK/RCKB. In an embodiment, the multi-phase clock generator 540 may also include a phase interpolator to interpolate the phases of the plurality of clock signals.

The internal circuit 550 may receive the plurality of internal clock signals INCK from the multi-phase clock generator 540. The internal circuit 550 may operate based on the plurality of internal clock signals INCK. The internal circuit 550 may include any logic circuit provided within the semiconductor apparatus 500 that operates in synchronization with the plurality of internal clock signals INCK and any other logic circuit that operates in connection with the logic circuit.

The semiconductor apparatus 500 may further include a duty detector 560 and a duty control circuit 570. The duty detector 560 may receive the reference clock signal pair RCK/RCKB. The duty detector 560 may generate a duty control signal DCC based on the reference clock signal pair RCK/RCKB. The duty detector 560 may generate the duty control signal DCC by detecting a duty cycle of the reference clock signal pair RCK/RCKB. For example, the duty detector 560 may represent the difference in duty cycle between the reference clock signal RCK and the complementary reference clock signal RCKB as the duty control signal DCC. When the duty cycle of the reference clock signal RCK is greater than the duty cycle of the complementary reference clock signal RCKB, the duty detector 560 may generate the duty control signal DCC having a high logic level. When the duty cycle of the reference clock signal RCK is less than the duty cycle of the complementary reference clock signal RCKB, the duty detector 560 may generate the duty control signal DCC having a low logic level. In an embodiment, the duty control signal DCC may be an analog voltage signal having various voltage levels or may be a digital signal comprising a plurality of bits. The duty detector 560 may generate the duty control signal DCC having a voltage level corresponding to a duty cycle difference between the reference clock signal pair RCK/RCKB or may generate the duty control signal DCC by quantizing the duty cycle difference between the reference clock signal pair RCK/RCKB. In an embodiment, the duty detector 560 may generate the duty control signal DCC by detecting the duty cycle of the reference clock signal RCK and the complementary reference clock signal RCKB, respectively.

The duty control circuit 570 may receive the duty control signal DCC from the duty detector 560. The duty control circuit 570 may generate the first and second bias control signals BC1 and BC2 based on the duty control signal DCC. The duty control circuit 570 may change the value of at least one of the first and second bias control signals BC1 and BC2 based on the duty control signal DCC. The duty control circuit 570 may provide the first and second bias control signals BC1 and BC2 to the second clock path 520. The duty control circuit 570 may further receive a duty mode signal DM. The duty mode signal DM may be a signal that distinguishes operation modes of the second clock path 520 and may specify a first duty operation mode and a second duty operation mode. The first duty operation mode may be a duty correction mode, and the second duty operation mode may be a duty distortion mode. The duty mode signal DM may have a first logic level to specify the first duty operation mode and may have a second logic level to specify the second duty operation mode. The duty control circuit 570 may further generate the switching signal OPT based on the duty mode signal DM and may change the first and second bias control signals BC1 and BC2 based on the duty mode signal DM. For example, based on the duty control signal DCC, the duty control circuit 570 may disable the switching signal OPT in the first duty operation mode and may generate the first and second bias control signals BC1 and BC2 such that a duty cycle difference between the second differential clock signal pair DCK2/DCK2B may be decreased. The duty control circuit 570 may enable the switching signal OPT in the second duty operation mode and may change the values of the first and second bias control signals BC1 and BC2 such that a duty cycle difference between the second differential clock signal pair DCK2/DCK2B occurs.

The second clock path 520 may include a first buffer 521, a second buffer 522, and a clock doubler 523. The first buffer 521 may receive the first system clock signal WCK1 and reference voltage VREF to generate a first clock signal AIN and a first complementary clock signal AINB. The first buffer 521 may differentially amplify the first system clock signal WCK1 and the reference voltage VREF to generate the first clock signal AIN and the first complementary clock signal AINB. The reference voltage VREF may have a voltage level corresponding to the middle of a range over which the first and second system clock signals WCK1 and WCK2 swing. The second buffer 522 may receive the second system clock signal WCK2 and the reference voltage VREF to generate a second clock signal BIN and a second complementary clock signal BINB. The second buffer 522 may differentially amplify the second system clock signal WCK2 and the reference voltage VREF to generate the second clock signal BIN and the second complementary clock signal BINB.

The clock doubler 523 may receive the first clock signal AIN, the first complementary clock signal AINB, the second clock signal BIN and the second complementary clock signal BINB from the first and second buffers 521 and 522 to generate the second differential clock signal pair DCK2/DCK2B. The clock doubler 523 may generate the second differential clock signal pair DCK2/DCK2B having a higher frequency than the first and second clock signals AIN and BIN. The clock doubler 523 may receive at least some of the first bias control signal BC1, the second bias control signal BC2, and the switching signal OPT from the duty control circuit 570. The clock doubler 523 may adjust the duty cycle of the second differential clock signal pair DCK2/DCK2B based on at least some of the first bias control signal BC1, the second bias control signal BC2 and the switching signal OPT. Any one of the clock doublers (100 and 400), shown in FIGS. 1 and 5, may be applied as the clock doubler 523. When the clock doubler 100/400 is applied as the clock doubler 523, the output clock signal OUT and the complementary output clock signal OUTB may correspond to the second differential clock signal pair DCK2/DCK2B.

The first clock path 510, the first buffer 521 and the second buffer circuit 522 may further receive the operation mode signal OM. The first clock path 510 may be enabled when the operation mode signal OM has a first logic level and may be disabled when the operation mode signal OM has a second logic level. The first and second buffers 521 and 522 may be enabled when the operation mode signal OM has the second logic level and may be disabled when the operation mode signal OM has the first logic level.

When the semiconductor apparatus 500 operates in the first operation mode, the semiconductor apparatus 500 may receive the first and second system clock signals WCK1 and WCK2 having a phase difference of 180 degrees. In the first operation mode, the first clock path 510 may be enabled, and the second clock path 520 may be disabled. The first clock path 510 may buffer the first and second system clock signals WCK1 and WCK2 to generate a first differential clock signal pair DCK1/DCK1B, and the selection circuit 530 may output the first differential clock signal pair DCK1/DCK1B as the reference clock signal pair RCK/RCKB. The multi-phase clock generator 540 may generate the plurality of internal clock signals INCK from the reference clock signal pair RCK/RCKB, and the internal circuit 550 may operate based on the plurality of internal clock signals INCK.

When the semiconductor apparatus 500 operates in the second operation mode, the semiconductor apparatus 500 may receive the first and second system clock signals WCK1 and WCK2 having a phase difference of 90 degrees. In the second operation mode, the first clock path 510 may be disabled, and the second clock path 520 may be enabled. The first and second buffers 521 and 522 may generate the first clock signal AIN, the first complementary clock signal AINB, the second clock signal BIN, and the second complementary clock signal BINB from the first and second system clock signals WCK1 and WCK2. The clock doubler 523 may generate the second differential clock signal pair DCK2/DCK2B having a higher frequency than the first and second system clock signals WCK1 and WCK2 based on the first clock signal AIN, the first complementary clock signal AINB, the second clock signal BIN, and the second complementary clock signal BINB. The selection circuit 530 may output the second differential clock signal pair DCK2/DCK2B as the reference clock signal pair RCK/RCKB. The multi-phase clock generator 540 may generate the plurality of internal clock signals INCK based on the reference clock signal pair RCK/RCKB. The duty detector 560 may generate the duty control signal DCC by detecting a duty cycle of the reference clock signal pair RCK/RCKB. In the first duty operation mode, the duty control circuit 570 may disable the switching signal OPT and may generate the first and second bias control signals BC1 and BC2 to decrease the duty cycle difference between the second differential clock signal pair DCK2/DCK2B based on the duty control signal DCC. The clock doubler 523 may correct the duty cycle of the second differential clock signal pair DCK2/DCK2B based on the switching signal OPT, the first bias control signal BC1, and the second bias control signal BC2. The semiconductor apparatus 500 may generate the plurality of internal clock signals INCK having a high frequency and a constant duty cycle in the first duty operation mode and may verify and/or test the reliability of the internal circuit 550 when the internal circuit 550 is operating at a high speed. In the second duty operation mode, the duty control circuit 570 may enable the switching signal OPT and generate the first and second bias control signals BC1 and BC2 such that a duty cycle difference between the second differential clock signal pair DCK2/DCK2B occurs based on the duty control signal DCC. The clock doubler 523 may generate a duty cycle difference between the second differential clock signal pair DCK2/DCK2B based on the first and second bias control signals BC1 and BC2. The semiconductor apparatus 500 may generate the plurality of internal clock signals INCK having a high frequency but having a duty cycle difference in the second duty operation mode and may cause the internal circuit 500 to operate based on the plurality of internal clock signals INCK having a duty cycle difference. Thus, among the internal circuits 550 of the semiconductor apparatus 500, internal circuit with insufficient performance and/or margin can be detected.

A person skilled in the art to which the present disclosure pertains can understand that the present disclosure may be carried out in other specific forms without changing its technical spirit or essential features. Therefore, it should be understood that the embodiments described above are illustrative in all aspects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A clock doubler comprising:
   a first differential gate configured to receive a first clock signal and a first complementary clock signal through a first differential input terminal of the first differential gate and receive a second clock signal and a second complementary clock signal through a second differential input terminal of the first differential gate to generate an output clock signal and configured to adjust a duty cycle of the output clock signal based on a first bias control signal; and
   a second differential gate configured to receive the second clock signal and the second complementary clock signal through a first differential input terminal of the second differential gate and receive the first clock signal and the first complementary clock signal through a second differential input terminal of the second differential gate to generate a complementary output clock signal and configured to adjust a duty cycle of the complementary output clock signal based on a second bias control signal,
   wherein a value of the second bias control signal is changed independently a value of the first bias control signal.

2. The clock doubler of claim 1, wherein the first differential gate comprises:
   a first differential circuit configured to:
      form a current path from a first negative output node to a first common node when the first and second clock signals have the same logic level;
      form a current path from a first positive output node to the first common node when the first and second clock signals have different logic levels; and
      output the output clock signal through the first negative output node,
      wherein the first positive output node and the first negative output node are coupled to a terminal to which a first power supply voltage is supplied; and
   a first bias circuit configured to adjust an amount of current flowing from the first common node to a terminal to which a second power supply voltage is supplied based on the first bias control signal.

3. The clock doubler of claim 1, wherein the second differential gate comprises:
   a second differential circuit configured to:
      form a current path from a second negative output node to a second common node when the first and second clock signals have same logic level;
      form a current path from a second positive output node to the second common node when the first and second clock signals have different logic levels;
      output the complementary output clock signal through the second positive output node,
      wherein the second positive output node and the second negative output node are coupled to a terminal to which a first power supply voltage is supplied; and
   a second bias circuit configured to adjust an amount of current flowing from the second common node to a terminal to which a second power supply voltage is supplied based on the second bias control signal.

4. The clock doubler of claim 1, further comprising a duty control circuit configured to generate the first bias control signal and the second bias control signal based on a duty control signal.

5. The clock doubler of claim 1, further comprising a duty control circuit configured to generate the first bias control signal and the second bias control signal based on a duty mode signal and a duty control signal.

6. A clock doubler comprising:
   a first differential gate configured to receive a first clock signal, a first complementary clock signal, a second clock signal, and a second complementary clock signal to generate a complementary preliminary output clock signal and configured to adjust a duty cycle of the complementary preliminary output clock signal based on a first bias control signal;
   a second differential gate configured to receive the first clock signal, the first complementary clock signal, the second clock signal, and the second complementary clock signal to generate a preliminary output clock signal and configured to adjust a duty cycle of the preliminary output clock signal based on a second bias control signal; and an output buffer configured to differentially amplify the preliminary output clock signal and the complementary preliminary output clock signal to generate an output clock signal and a complementary output clock signal and configured to selectively adjust a duty cycle of the output clock signal and the complementary output clock signal based on a switching signal.

7. The clock doubler of claim 6,
wherein the first differential gate is configured to receive the first clock signal and the first complementary clock signal through a first differential input terminal of the first differential gate and configured to receive the second clock signal and the second complementary clock signal through a second differential input terminal of the first differential gate, and
wherein the second differential gate is configured to receive the second clock signal and the second complementary clock signal through a first differential input terminal of the second differential gate and configured to receive the first clock signal and the first complementary clock signal through a second differential input terminal of the second differential gate.

8. The clock doubler of claim 6, wherein the first differential gate comprises:
a first differential circuit configured to:
form a current path from a first negative output node to a first common node when the first and second clock signals have the same logic level;
form a current path from a first positive output node to the first common node when the first and second clock signals have different logic levels;
output the complementary preliminary output clock signal through the first positive output node,
wherein the first positive output node and the first negative output node are coupled to a terminal to which a first power supply voltage is supplied; and
a first bias circuit configured to adjust an amount of current flowing from the first common node to a terminal to which a second power supply voltage is supplied based on the first bias control signal.

9. The clock doubler of claim 6, wherein the second differential gate comprises:
a second differential circuit configured to:
form a current path from a second negative output node to a second common node when the first and second clock signals have same logic level;
form a current path from a second positive output node to the second common node when the first and second clock signals have different logic levels;
output the preliminary output clock signal through the second negative output node,
wherein the second positive output node and the second negative output node are coupled to a terminal to which a first power supply voltage is supplied; and
a second bias circuit configured to adjust an amount of current flowing from the second common node to a terminal to which a second power supply voltage is supplied based on the second bias control signal.

10. The clock doubler of claim 6, wherein the output buffer comprises:
a first transistor connected between a first output node and a first node, the first transistor changing a voltage level of the first output node based on the complementary preliminary output clock signal, the first output node being coupled to a terminal to which a first power supply voltage is supplied, and the output clock signal being output from the first output node;
a second transistor connected between a second output node and a second node, the second transistor changing a voltage level of the second output node based on the preliminary output clock signal, the second output node being coupled to a terminal to which the first power supply voltage is supplied, and the complementary output clock signal being output from the second output node;
a capacitor coupled between the first and second nodes;
a switch selectively connecting the first node to the second nodes based on the switching signal;
a first current source coupled between the first node and a terminal to which a second power supply voltage is supplied; and
a second current source coupled between the second node and the terminal to which the second power supply voltage is supplied.

11. The clock doubler of claim 6, further comprising a duty control circuit configured to generate the first bias control signal, the second bias control signal, and the switching signal based on a duty mode signal and a duty control signal.

12. A semiconductor apparatus comprising:
a first clock path configured to buffer a first system clock signal and a second system clock signal to generate a first differential clock signal pair;
a second clock path configured to generate a second differential clock signal pair from the first system clock signal and the second system clock signal and configured to adjust a duty cycle of the second differential clock signal pair based on a first bias control signal and a second bias control signal, wherein the second differential clock signal pair have a frequency higher than the first and second system clock signals;
a selection circuit configured to output one of the first and second differential clock signal pairs as a reference clock signal pair based on an operation mode signal; and
a multi-phase clock generator configured to generate a plurality of internal clock signals based on the reference clock signal pair.

13. The semiconductor apparatus of claim 12, wherein, when the operation mode signal is at a first logic level, the second system clock signal has a phase difference of 180 degrees from the first system clock signal, and
wherein, when the operation mode signal is at a second logic level, the second system clock signal has a phase difference of 90 degrees from the first system clock signal.

14. The semiconductor apparatus of claim 12, wherein, when the operation mode signal is at a first logic level, the first clock path is activated, and
wherein, when the operation mode signal is at a second logic level, the second clock path is activated.

15. The semiconductor apparatus of claim 12, wherein the second clock path comprises:
a first buffer circuit configured to generate a first clock signal and a first complementary clock signal from the first system clock signal;
a second buffer circuit configured to generate a second clock signal and a second complementary clock signal from the second system clock signal; and
a clock doubler configured to generate the second differential clock signal pair from the first clock signal, the first complementary clock signal, the second clock signal, and the second complementary clock signal based on the first bias control signal and the second bias control signal.

16. The semiconductor apparatus of claim 15, wherein the clock doubler comprises:
- a first differential gate configured to generate an output clock signal from the first clock signal, the first complementary clock signal, the second clock signal, and the second complementary clock signal and configured to adjust a duty cycle of the output clock signal based on the first bias control signal; and
- a second differential gate configured to generate a complementary output clock signal from the first clock signal, the first complementary clock signal, the second clock signal, and the second complementary clock signal and configured to adjust a duty cycle of the complementary output clock signal based on the second bias control signal,
- wherein the output clock signal and the complementary output clock signal are provided as the second differential clock signal pair.

17. The semiconductor apparatus of claim 16, further comprising:
- a duty detector configured to generate a duty control signal by detecting a duty cycle of the reference clock signal pair; and
- a duty control circuit configured to generate the first bias signal and the second bias signal based on a duty mode signal and the duty control signal.

18. The semiconductor apparatus of claim 15, wherein the clock doubler further receives a switching signal and comprises:
- a first differential gate configured to receive the first clock signal, the first complementary clock signal, the second clock signal, and the second complementary clock signal to generate a complementary preliminary output clock signal and configured to adjust a duty cycle of the complementary preliminary output clock signal based on the first bias control signal;
- a second differential gate configured to receive the first clock signal, the first complementary clock signal, the second clock signal, and the second complementary clock signal to generate a preliminary output clock signal and configured to adjust a duty cycle of the preliminary output clock signal based on the second bias control signal; and
- an output buffer configured to differentially amplify the preliminary output clock signal and the complementary preliminary output clock signal to generate an output clock signal and a complementary output clock signal and configured to selectively adjust a duty cycle of the output clock signal and the complementary output clock signal based on the switching signal,
- wherein the output clock signal and the complementary output clock signal are provided as the second differential clock signal pair.

19. The semiconductor apparatus of claim 18, further comprising:
- a duty detector configured to generate a duty control signal by detecting a duty cycle of the reference clock signal pair; and
- a duty control circuit configured to generate the first bias signal, the second bias signal, and the switching signal based on a duty mode signal and the duty control signal.

20. The semiconductor apparatus of claim 12, wherein the selection circuit is configured to output the first differential clock signal pair as the reference clock signal pair when the operation mode signal is at a first logic level and configured to output the second differential clock signal pair as the reference clock signal pair when the operation mode signal is at a second logic level.

* * * * *